United States Patent
Tsai et al.

(10) Patent No.: US 11,171,039 B2
(45) Date of Patent: Nov. 9, 2021

(54) COMPOSITE SEMICONDUCTOR SUBSTRATE, SEMICONDUCTOR DEVICE AND METHOD FOR MANUFACTURING THE SAME

(71) Applicant: TAIWAN SEMICONDUCTOR MANUFACTURING COMPANY LTD., Hsinchu (TW)

(72) Inventors: Min-Ying Tsai, Kaohsiung (TW); Cheng-Ta Wu, Chiayi County (TW); Yu-Hung Cheng, Tainan (TW); Yeur-Luen Tu, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/939,883

(22) Filed: Mar. 29, 2018

(65) Prior Publication Data
US 2019/0304829 A1 Oct. 3, 2019

(51) Int. Cl.
*H01L 21/763* (2006.01)
*H01L 29/04* (2006.01)
(Continued)

(52) U.S. Cl.
CPC ........ *H01L 21/763* (2013.01); *H01L 21/0257* (2013.01); *H01L 21/0262* (2013.01);
(Continued)

(58) Field of Classification Search
CPC ............. H01L 21/763; H01L 21/02595; H01L 29/1083; H01L 21/0257; H01L 21/02532;
(Continued)

(56) References Cited

U.S. PATENT DOCUMENTS 4,012,762 A * 3/1977 Abe .................. H01L 21/00
257/372
4,014,037 A * 3/1977 Matsushita ........... H01L 21/314
257/636
(Continued)

FOREIGN PATENT DOCUMENTS

CN 14677965 A 1/2004
CN 107430982 A 12/2017
(Continued)

OTHER PUBLICATIONS

Office Action and Search Report dated Dec. 25, 2020 issued by Taiwan Intellectual Property Office for counterpart application No. 107132665.
(Continued)

*Primary Examiner* — Thanh Y. Tran
(74) *Attorney, Agent, or Firm* — WPAT, P.C., Intellectual Property Attorneys; Anthony King (57) ABSTRACT

A composite semiconductor substrate includes a semiconductor substrate, an oxygen-doped crystalline semiconductor layer and an insulative layer. The oxygen-doped crystalline semiconductor layer is over the semiconductor substrate, and the oxygen-doped crystalline semiconductor layer includes a crystalline semiconductor material and a plurality of oxygen dopants. The insulative layer is over the oxygen-doped crystalline semiconductor layer.

20 Claims, 6 Drawing Sheets

(51) Int. Cl.
  *H01L 29/32*   (2006.01)
  *H01L 21/02*   (2006.01)
  *H01L 21/762*  (2006.01)
  *H01L 29/10*   (2006.01)
  *H01L 23/66*   (2006.01)

(52) U.S. Cl.
  CPC .. *H01L 21/02532* (2013.01); *H01L 21/02595* (2013.01); *H01L 21/7624* (2013.01); *H01L 23/66* (2013.01); *H01L 29/04* (2013.01); *H01L 29/1083* (2013.01); *H01L 29/32* (2013.01); *H01L 21/02238* (2013.01); *H01L 21/02255* (2013.01)

(58) Field of Classification Search
  CPC ............... H01L 29/04; H01L 21/02238; H01L 21/02255; H01L 29/32; H01L 21/7624; H01L 21/0262
  See application file for complete search history.

(56) References Cited

U.S. PATENT DOCUMENTS

| | | | | |
|---|---|---|---|---|
| 4,080,619 | A | * | 3/1978 | Suzuki ................... H01L 21/00 257/591 |
| 4,114,254 | A | * | 9/1978 | Aoki ....................... H01L 21/00 438/299 |
| 4,174,252 | A | * | 11/1979 | Kressel ............. H01L 21/32134 438/702 |
| 4,242,697 | A | * | 12/1980 | Berthold ............... H01L 21/314 257/146 |
| 4,344,985 | A | * | 8/1982 | Goodman ............. H01L 21/314 438/763 |
| 4,420,765 | A | * | 12/1983 | Tarng ................... H01L 21/314 257/636 |
| 4,901,133 | A | * | 2/1990 | Curran ................. H01L 21/314 257/637 |
| 6,369,438 | B1 | * | 4/2002 | Sugiyama ......... H01L 21/02381 257/192 |
| 2004/0018701 | A1 | | 1/2004 | Ueda |
| 2007/0190697 | A1 | * | 8/2007 | Kothandaraman ......................... H01L 23/5256 438/132 |
| 2018/0033681 | A1 | * | 2/2018 | Ishikawa ........... H01L 29/78603 |

FOREIGN PATENT DOCUMENTS

| | | |
|---|---|---|
| CN | 107785302 A | 3/2018 |
| JP | H10209453 A | 8/1998 |
| WO | WO2014080565 A1 | 5/2014 |

OTHER PUBLICATIONS

Office Action, Cited References and Search Report dated Jan. 19, 2021 issued by China National Intellectual Property Administration for counterpart application No. 201811241036.3.
US20180033681A1 corresponds to CN107430982A.
US20040018701A1 corresponds to CN1467795A.
English Abstract of CN107785302A.
English Abstract of JPH10209453A.
Office Action dated Jun. 22, 2021 issued by the China National Intellectual Property Administration for the Chinese Patent Application No. 201811241036.3.

* cited by examiner

COMPOSITE SEMICONDUCTOR SUBSTRATE, SEMICONDUCTOR DEVICE AND METHOD FOR MANUFACTURING THE SAME

BACKGROUND

Semiconductor dies are fabricated on a semiconductor substrate by various manufacturing operations such as deposition, photolithography, etching, implantation or the like. In recent years, composite semiconductor substrate such as silicon-on-insulator (SOI) substrate has been developed as an alternative substrate. The SOI substrate is a substrate which has a device silicon layer separated from an underlying handle silicon wafer by an insulative layer. The SOI substrate has advantages such as reduced parasitic capacitances, reduced power consumption, reduced current leakage and increased ability to operate at more elevated temperature.

The handle silicon wafer has high resistivity, which allows to meet some application requirements such as device-to-device isolation, passive device Q-factors, etc. Due to the low dopant of the handle silicon wafer, carriers tend to accumulate adjacent to the interface between the handle silicon wafer and the insulative layer. The voltage applied to the overlying device may interact with the accumulated carriers, deteriorating performance of the overlying device. In some applications such as radio frequency (RF) application, the RF signals may suffer from cross-talk and non-linear distortion.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first." "second" and "third" describe various elements, components, regions, layers and/or sections, these elements, components, regions, layers and/or sections should not be limited by these terms. These terms may be only used to distinguish one element, component, region, layer or section from another. The terms such as "first." "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±40, less than or equal to ±3°, less than or equal to ±2, less than or equal to ±1°, less than or equal to ±0.5°, less than or equal to ±0.1° or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The characteristic of a composite semiconductor substrate is that a semiconductor region in which circuitry is formed is isolated from a bulk substrate by an electrically insulating layer. One advantage of isolating circuitry from the bulk substrate is a decrease in parasitic capacitance. Therefore, the composite semiconductor substrate is appealing for high frequency applications such as radio frequency (RF) communication circuits. As the demands for the quality and performance of RF devices increase, the requirements for high linearity and precision of the RF circuits continue to increase as well. Among other requirements, attempts have been made to keep signals in one portion of a circuit from affecting and degrading signals in another portion of the circuit. This effect is known as cross-talk. The mitigation of cross talk is of critical importance for RF communication circuits because the impedance of certain parasitic pathways within a circuit tends to reach a minimum at frequencies that are used to carry signals in RF circuits. Since these same parasitic pathways connect nodes within a circuit that carry differing signals, the problem of cross-talk is especially problematic for RF applications. In addition, it is critically important for the parasitic capacitances to which the signals within a circuit may be exposed not to be signal dependent. This requirement is critical because it is difficult to calibrate out an error that is signal dependent, and such errors are inherently nonlinear.

In one or more embodiments of the present disclosure, a composite semiconductor substrate such as a silicon-on-insulator (SOI) substrate is provided. The composite semiconductor substrate includes a bulk substrate such as a semiconductor substrate, an oxygen-doped crystalline semiconductor layer, and an insulative layer. The oxygen-doped crystalline semiconductor layer is configured as a trap-rich layer. The oxygen-doped crystalline semiconductor layer includes one or more crystalline material configured to trap carriers. The crystalline material may include polycrystalline semiconductor material such as polycrystalline silicon. The oxygen-doped crystalline semiconductor layer further includes oxygen dopants configured to help to inhibit regrowth of the grain size in the trap-rich layer during thermal operations, and also help to increase the resistivity of the trap-rich layer. Accordingly, parasitic capacitance can be reduced, and leakage current can be alleviated. For some high frequency applications such as RF application, the reduced parasitic capacitance and reduced leakage current can help to alleviate non-linear distortion to RF signals and mitigate cross-talk, and help to improve RF device performance. The oxygen-doped crystalline semiconductor layer can be formed by deposition, and thus has a flatter surface. Therefore, a planarization operation such as a CMP operation may be omitted.

Figure 1:
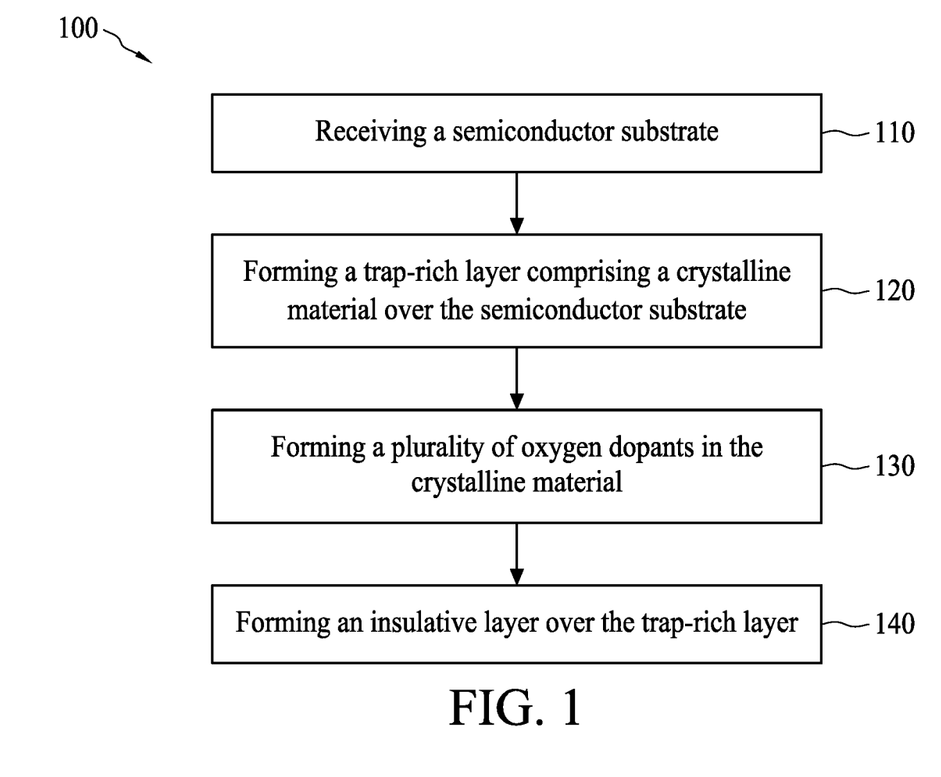
FIG. 1 is a flow chart illustrating a method for manufacturing a composite substrate according to various aspects of one or more embodiments of the present disclosure.

FIG. 1 is a flow chart illustrating a method for manufacturing a composite semiconductor substrate according to various aspects of one or more embodiments of the present disclosure. The method 100 begins with operation 110 in which a semiconductor substrate is received. The method 100 proceeds with operation 120 in which a trap-rich layer comprising a crystalline material is formed over the semiconductor substrate. The method 100 proceeds with operation 130 in which a plurality of oxygen dopants are formed in the crystalline material. The method 100 continues with operation 140 in which an insulative layer is formed over the trap-rich layer.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
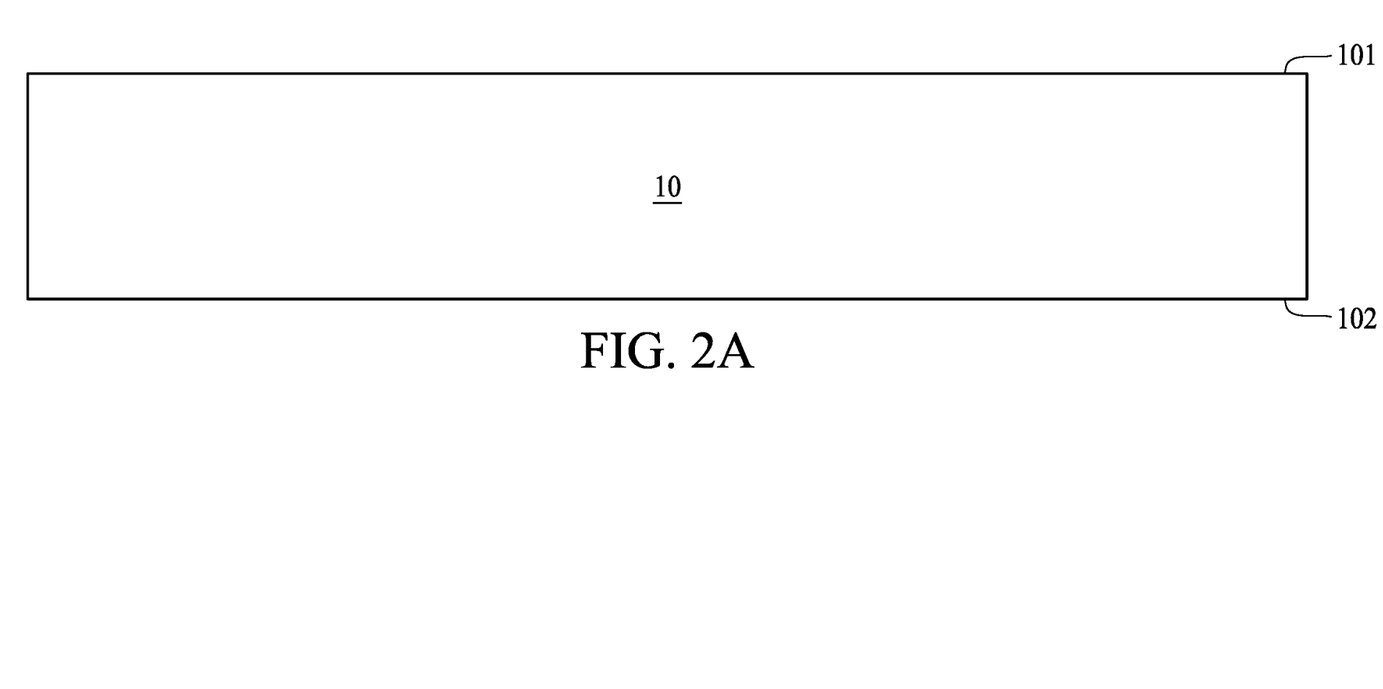
FIG. 2A, FIG. 2B, FIG. 2C and FIG. 2D are schematic views at one of various operations of manufacturing a composite semiconductor substrate according to one or more embodiments of the present disclosure.

FIG. 2A, FIG. 2B, FIG. 2C and FIG. 2D are schematic views at one of various operations of manufacturing a composite semiconductor substrate according to one or more embodiments of the present disclosure. As shown in FIG. 2A and operation 110 in FIG. 1, a semiconductor substrate 10 is received. The semiconductor substrate 10 may include a bulk substrate. The semiconductor substrate 10 has a first surface 101 and a second surface 102 opposite to the first surface 101. In some embodiments, the semiconductor substrate 10 is a handle substrate configured as a base for handling and building up overlying layers to be formed. In some embodiments, the semiconductor substrate 10 is a high resistivity handle substrate. By way of example, the semiconductor substrate 10 may have a resistivity greater than 1KΩ-cm, but is not limited thereto. In some embodiments, the semiconductor substrate 10 includes a silicon wafer such as a monocrystalline silicon substrate, but is not limited thereto. In some embodiments, the material of the semiconductor substrate 10 may include other semiconductive materials such as III-V semiconductor material, silicon carbide, silicon germanium, germanium, gallium arsenide or the like.

Figure 2B:
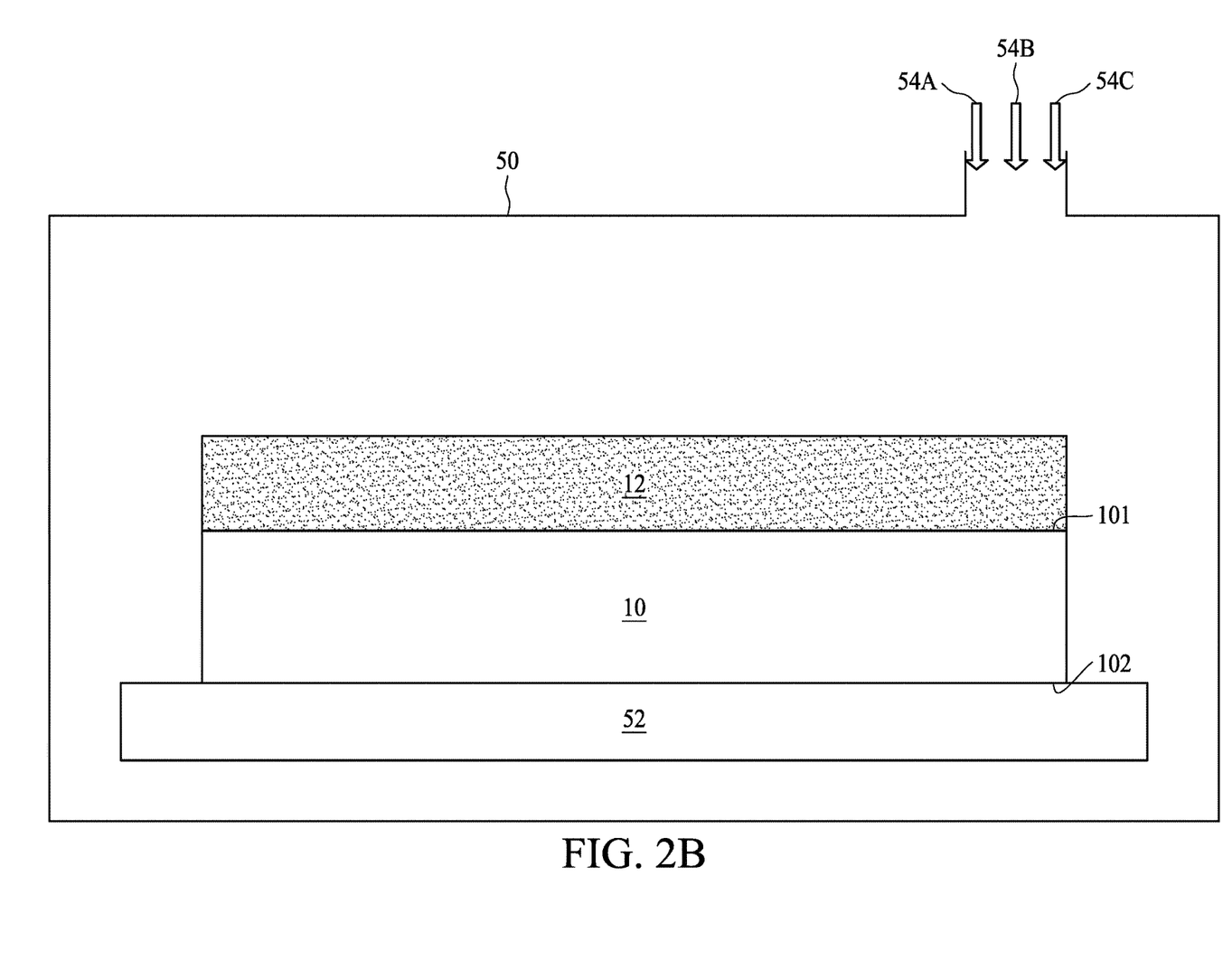

As shown in FIG. 2B and operation 120 in FIG. 1, a trap-rich layer 12 is formed over the semiconductor substrate 10. The trap-rich layer 12 may be in contact with the semiconductor substrate 10. The trap-rich layer 12 includes a crystalline material. The crystalline material may include crystal defects, which may be configured to trap carriers. In some embodiments, the crystalline material may include crystalline semiconductor material such as polycrystalline semiconductor material. By way of example, the polycrystalline semiconductor material may include polycrystalline silicon or the like. In some embodiments, the polycrystalline semiconductor material may be re-crystallized from an amorphous semiconductor material.

In some embodiments, the trap-rich layer 12 refers to a semiconductor layer having crystal defects able to trap carriers. The crystal defects of the trap-rich layer 12 may include dislocations (i.e., areas where the atoms are out of position or misaligned within a crystal lattice) and/or oxidation induced stacking faults (OISF). The crystal defects may be recombination centers configured to trap carriers from the insulative layer. Once trapped within the recombination centers, the lifetime of the carriers is decreased. Accordingly, the accumulation of carriers along a top surface of the semiconductor substrate 10 is reduced, mitigating parasitic surface conduction that introduces non-linear distortions into radio frequency (RF) signals.

In some embodiments, the trap-rich layer 12 may be formed by deposition operation, but is not limited thereto. As shown in FIG. 2B, the semiconductor substrate 10 may be loaded in a reaction chamber 50 of a furnace tool, and disposed on a supporter 52 such as a chuck in the reaction chamber 50. The crystalline material such as polycrystalline silicon may be formed over the semiconductor substrate 10 by introducing a source gas 54A to the reaction chamber 50. The furnace tool includes a heater to heat the source gas 54A in the reaction chamber 50. The source gas 54A is decomposed, thereby forming the trap-rich layer 12 over the semiconductor substrate 10. In some embodiments, the source gas 54A may include a silicon-containing gas such as silane, dichlorosilane (DCS), a combination thereof, or the like. In some embodiments, the temperature in the reaction chamber 50 when forming the trap-rich layer 12 is controlled at a relatively low temperature in comparison to that in an epitaxial operation to mitigate overgrowing of the grain size of polycrystalline silicon. In some embodiments, the temperature in the reaction chamber 50 when forming the trap-rich layer 12 is lower than 900° C. By way of example, the temperature in the reaction chamber 50 is ranging from about 550° C. to about 650° C., but is not limited thereto. In some embodiments, the pressure in the reaction chamber 50 when forming the trap-rich layer 12 is relatively low, for example, the pressure is ranging from about 0.25 Torr to about 20 Torr, but is not limited thereto.

As shown in FIG. 2B and operation 130 in FIG. 1, a plurality of oxygen dopants are formed in the crystalline material. In some embodiments, the oxygen dopants may be formed along with formation of the crystalline material. For example, the plurality of oxygen dopants may be formed by introducing an oxygen-containing gas 54B to the reaction chamber 50 during formation of the polycrystalline silicon. By way of example, the oxygen-containing gas 54B may include hydrogen peroxide gas, nitrous oxide gas, oxygen gas, a combination thereof, or the like. In some embodiments, a carrier gas 54C such as nitrogen gas, argon gas, or the like may be introduced into the reaction chamber 50 to carry the source gas 54A and/or the oxygen-containing gas 54B. The amount of the oxygen-containing gas 54B with respect to the amount of the source gas 54A may be adjusted to modify the ratio of oxygen to polycrystalline silicon.

In some embodiments, the amount of the oxygen-containing gas 54B with respect to the amount of the source gas 54A may be adjusted in order to further modify the resistivity of the trap-rich layer 12. For example, when a relatively higher resistivity of the trap-rich layer 12 is required, the amount of the oxygen-containing gas 54B with respect to the amount of the source gas 54A may be increased. When a relatively lower resistivity of the trap-rich layer 12 is required, the amount of the oxygen-containing gas 54B with respect to the amount of the source gas 54A may be decreased. In some embodiments, the resistivity of the trap-rich layer 12 may be ranging from about 1KΩ-cm to about 9KΩ-cm, but is not limited thereto.

The trap-rich layer 12 including the crystalline material (e.g., polycrystalline silicon) and the oxygen dopants forms an oxygen-doped crystalline semiconductor layer. The polycrystalline silicon in the oxygen-doped crystalline semiconductor layer is configured to trap carriers, thereby helping to mitigate parasitic capacitance and leakage current. The oxygen dopants in the oxygen-doped crystalline semiconductor layer can help to inhibit growth of grain size of the polycrystalline silicon when forming the polycrystalline silicon. The oxygen dopants in the oxygen-doped crystalline semiconductor layer can further inhibit regrowth of grain size of the polycrystalline silicon during successive thermal operations. In some embodiments, the grain size of the crystalline semiconductor material in the oxygen-doped crystalline semiconductor layer is smaller than or equal to 0.1 micrometers. By way of example, the grain size of the crystalline semiconductor material in the oxygen-doped crystalline semiconductor layer is substantially ranging from 0.03 micrometers to 0.1 micrometers. The grain size of the crystalline semiconductor material in the oxygen-doped crystalline semiconductor layer is substantially ranging from 0.03 micrometers to 0.08 micrometers. The grain size of the crystalline semiconductor material in the oxygen-doped crystalline semiconductor layer is substantially ranging from 0.03 micrometers to 0.05 micrometers. As the grain size of the polycrystalline silicon is controlled to be small, more grain boundaries generate in the polycrystalline silicon. Accordingly, carrier trapping ability of the trap-rich layer 12 can be increased.

In some embodiments, a ratio of the amount of the oxygen dopants to the amount of the crystalline semiconductor material is ranging from about 0.05 to about 0.2, ranging from about 0.05 to about 0.15, or ranging from about 0.05 to about 0.1, but is not limited thereto. For example, the concentration of oxygen dopants in the trap-rich layer 12 may be in a range from about 5E19 atoms/cm$^3$ to about 1E21 atoms/cm$^3$, and the concentration of polycrystalline silicon may be about 1E22 atoms/cm$^3$. In some embodiments, the concentration of oxygen dopant in the trap-rich layer 12 may be substantially constant. In some other embodiments, the concentration of oxygen dopant in the trap-rich layer 12 may vary along a depth direction. By way of example, the concentration of oxygen dopant in the trap-rich layer 12 may increase along the depth direction from an upper surface distal to the semiconductor substrate 10 to a bottom surface proximal to the semiconductor substrate 10. The concentration of oxygen dopant in the trap-rich layer 12 may decrease along the depth direction from the upper surface to the bottom surface. The concentration of oxygen dopant in the trap-rich layer 12 may vary along the depth direction in a continuous manner, or in a multi-stage manner.

The trap-rich layer 12 formed by deposition operation can have a relatively flatter surface in contrast to an epitaxially growing crystalline semiconductor layer. Since the trap-rich layer 12 has a flatter surface, the originally formed thickness of the trap-rich layer 12 may be the same as its target thickness, and a successive planarization operation such as a CMP operation may be omitted. Accordingly, manufacturing costs may be reduced. In some embodiments, the thickness of the trap-rich layer 12 may be smaller than or equal to 2.5 micrometers, for example, between about 1.8 micrometers and about 2.0 micrometers, but is not limited thereto.

In some embodiments, the trap-rich layer 12 may be in electrical contact with the semiconductor substrate 10. In some alternative embodiments, an intervening layer that does not interfere with carrier transfer between the trap-rich layer 12 and the semiconductor substrate 10 may exist between the trap-rich layer 12 and the semiconductor substrate 10.

Figure 2C:
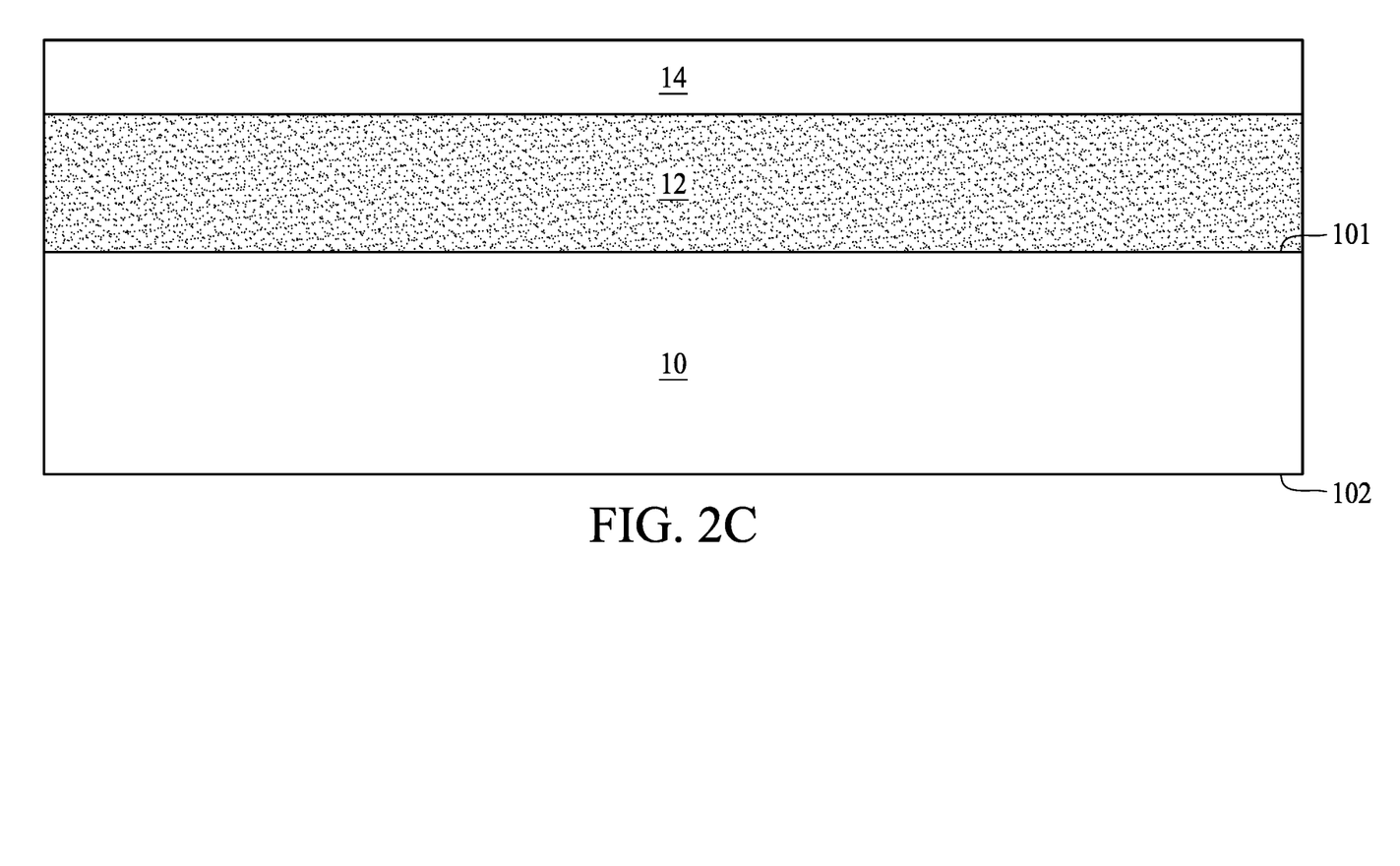

As shown in FIG. 2C and operation 140 in FIG. 1, an insulative layer 14 is formed over the trap-rich layer 12. In some embodiments, the insulative layer 14 includes a buried oxide layer. By way of example, the insulative layer 14 is a buried silicon oxide layer such as a thermal silicon oxide layer. In some embodiments, the buried oxide layer may be a thermal oxide layer formed by oxidization in a furnace. The insulative layer 14 may be formed by other suitable oxidization operations. The insulative layer 14 is configured to electrically isolate an active semiconductor layer to be formed from the semiconductor substrate 10. In some embodiments, a planarization operation such as a CMP operation may be performed upon the insulative layer 14 to planarize the surface of the insulative layer 14. In some other embodiments, the CMP operation for planarizing the insulative layer 14 may also be omitted since the insulative layer 14 is grown on the flat surface of the trap-rich layer 12.

Figure 2D:
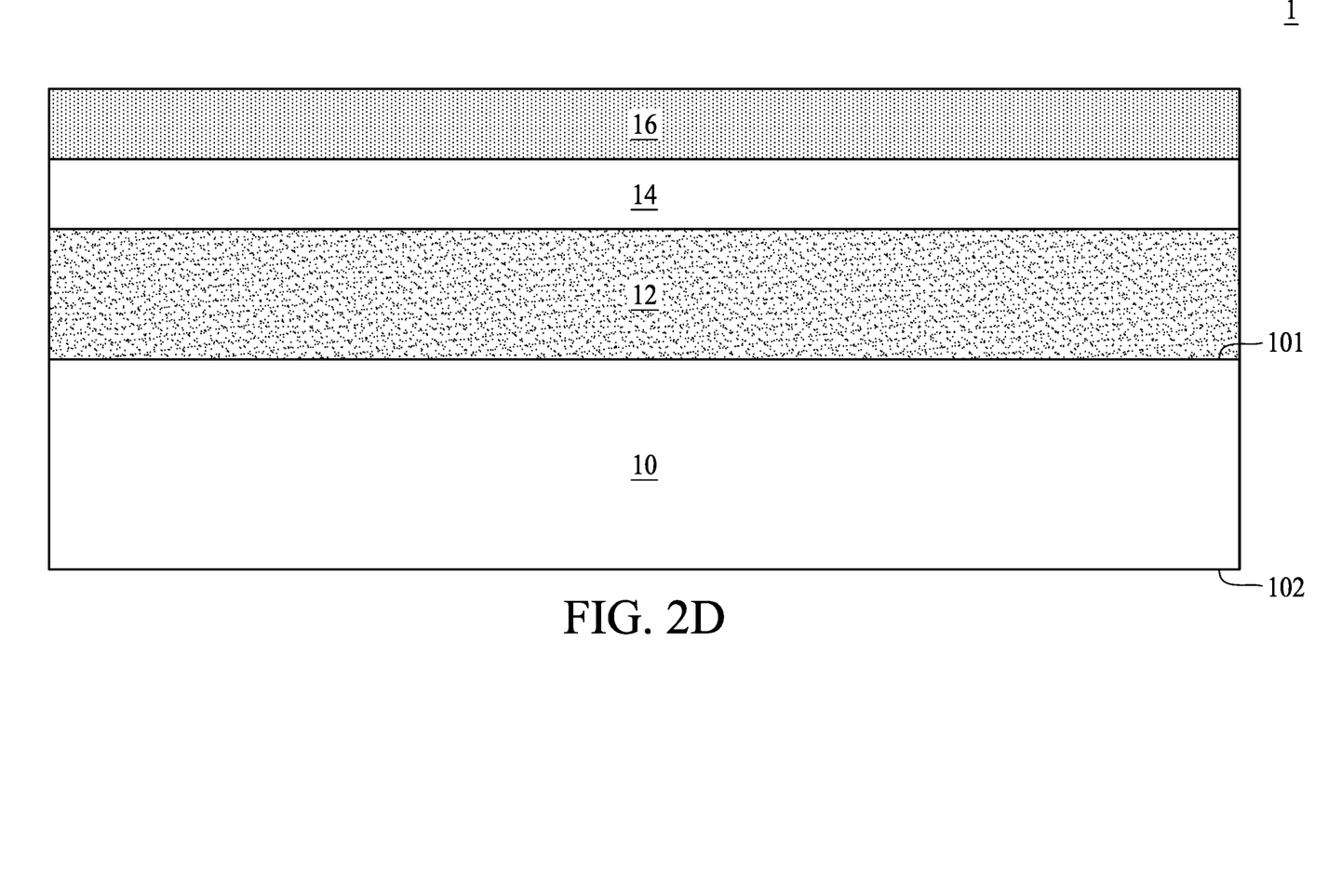

As shown in FIG. 2D, an active layer 16 may be formed over the insulative layer 14 to form a composite semiconductor substrate 1. The active layer 16 may be in contact with the trap-rich layer 12. In some embodiments, the active layer 16 may include an active semiconductor layer such as a superficial silicon layer or other semiconductor layers. In some embodiments, the active layer 16 may be formed by bonding a semiconductor wafer such as a silicon wafer to the insulative layer 14. In some embodiments, the semiconductor wafer may be thinned to a suitable thickness by e.g., grinding or polishing. In some embodiments, the active layer 16 may be configured as an active region for manufacturing a semiconductor component such as a passive device and/or an active device. In some embodiments, the semiconductor component may include a radio frequency (RF) device.

As shown in FIG. 2D, the composite semiconductor substrate 1 includes a trap-rich layer 12 interposed between the semiconductor substrate 10 and the insulative layer 14. The trap-rich layer 12 may be an oxygen-doped crystalline semiconductor layer includes a crystalline semiconductor material such as polycrystalline silicon, and oxygen dopants distributed in the crystalline semiconductor material. The oxygen-doped crystalline semiconductor layer is configured to trap carriers. The oxygen dopants in the oxygen-doped crystalline semiconductor layer can help to inhibit growth of grain size of the crystalline semiconductor material when forming the crystalline semiconductor material. The oxygen dopants in the oxygen-doped crystalline semiconductor layer can further help to inhibit regrowth of grain size of the polycrystalline silicon during successive thermal operations. By virtue of the oxygen dopants, the grain size of the crystalline semiconductor material in the oxygen-doped crystalline semiconductor layer may be controlled to be smaller than or equal to 0.1 micrometers. The oxygen dopants in the oxygen-doped crystalline semiconductor layer can also help to generate more grain boundaries with crystal defects in the crystalline semiconductor material, and thus the carrier trapping ability of the oxygen-doped crystalline semiconductor layer can be increased. Accordingly, parasitic capacitance of the composite semiconductor substrate can be reduced, and leakage current can be alleviated. For some high frequency applications such as radio frequency (RF) communication circuits application, the reduced parasitic capacitance and reduced leakage current can help to alleviate non-linear distortion to RF signals, and help to improve RF device performance. During fabrication of devices such as RF switch, the composite semiconductor substrate may undergo some anneal operations or experience high temperature. The oxygen dopants of the oxygen-doped crystalline semiconductor layer are configured to block the grains of the crystalline semiconductor material from abutting each other, and thus may help to inhibit regrowth of the grains during anneal operations or at high temperature.

The composite semiconductor substrate and semiconductor device of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3:
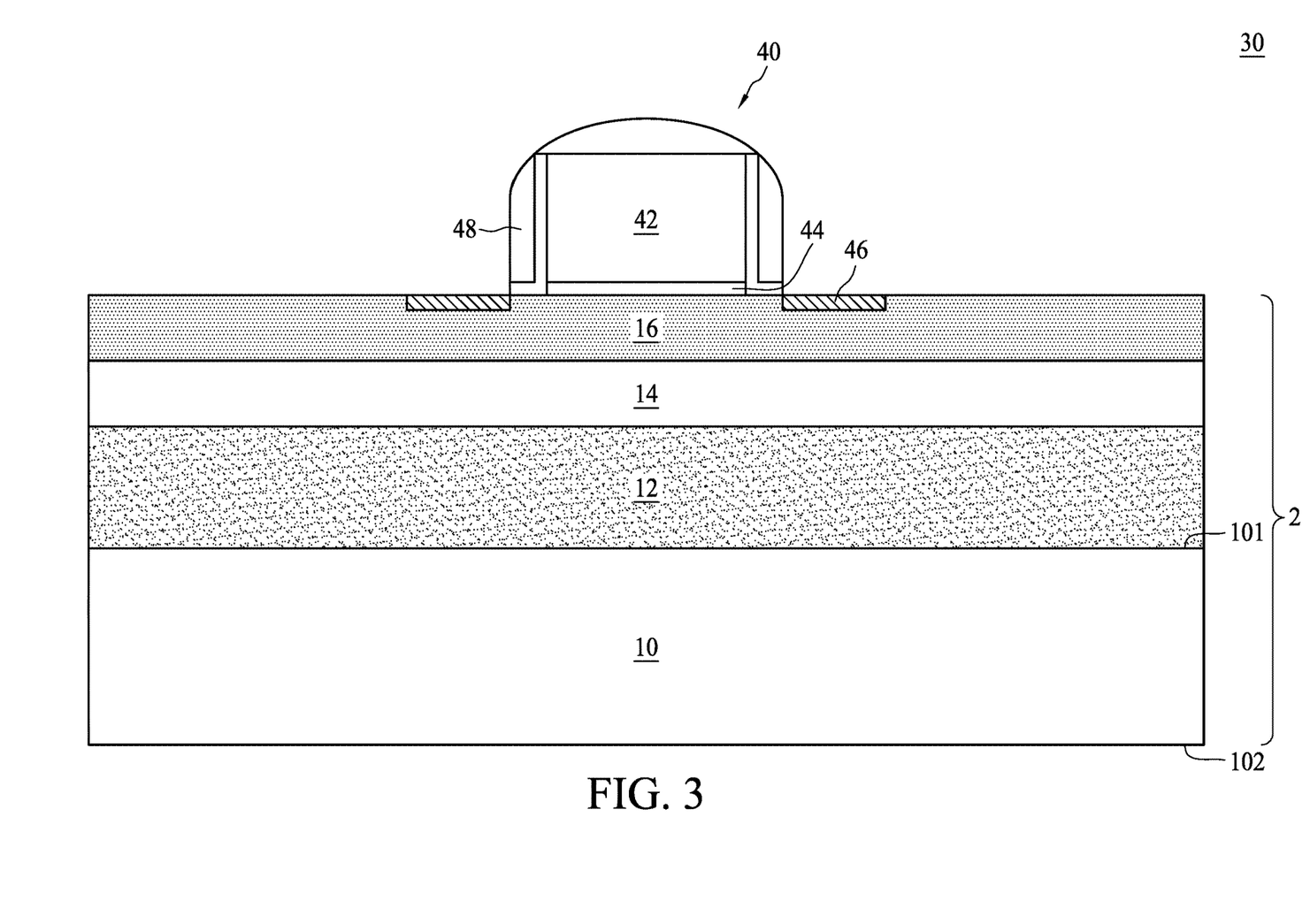
FIG. 3 is a schematic view of a semiconductor device according to some embodiments of the present disclosure.

FIG. 3 is a schematic view of a semiconductor device according to some embodiments of the present disclosure. As shown in FIG. 3, the semiconductor device 30 may include a composite semiconductor substrate 2 and a semiconductor component 40. The composite semiconductor substrate 2 includes a semiconductor substrate 10, a trap-rich layer 12, an insulative layer 14 and an active layer 16. The trap-rich layer 12 may be an oxygen-doped crystalline semiconductor layer includes a crystalline semiconductor material such as polycrystalline silicon, and oxygen dopants distributed in the crystalline semiconductor material. The trap-rich layer 12 may be configured to trap carriers. The configurations of the semiconductor substrate 10, the trap-rich layers 12, the insulative layer 14 and the active layer 16 may be similar to the composite semiconductor substrate 1 as illustrated in FIG. 2D.

The semiconductor component 40 is disposed over the composite semiconductor substrate 2. In some embodiments, the semiconductor component 40 may include an RF (radio frequency) transistor or the like. In some embodiments, the semiconductor component 40 may include a gate electrode 42, a gate insulation layer 44, source/drain regions 46 and spacer structures 48. The gate electrode 42 may be disposed over the active layer 16. The gate insulation layer 44 may be disposed between the gate electrode 42 and the active layer 16. The source/drain regions 46 may be formed in the active layer 16 at opposite sides of the gate electrode 42. The spacer structures 48 may be disposed on opposite sides of the gate electrode 42. In some alternative embodiments, the semiconductor component 40 may include an RF device such as an RF switch device, or the like.

In case the period of an RF signal is shorter than a majority carrier relaxation time, the majority carriers in semiconductor substrate 10 may not respond to the RF signal. The majority carriers may appear to be frozen and the semiconductor substrate 10 may behave as a dielectric. However, silicon has certain characteristics that may produce undesirable behavior in some RF applications. For example, the doping level in the high resistivity semiconductor substrate 10 is very low or non-existent. Therefore, oxide charges at the surface of the semiconductor substrate 10, or a weak electric field in the semiconductor substrate 10 can induce an inversion or accumulation layer, which may function as a surface conduction layer at the surface of the semiconductor substrate 10. RF signals traversing above the surface of the semiconductor substrate 10 may modulate the surface conduction layer, which may cause non-linear capacitance, non-linear conductance, or both affecting RF interactions between the semiconductor substrate 10 and other overlying layers. The non-linear characteristics may introduce harmonic distortion in the RF signals, which may exceed allowable limits. The trap-rich layer 12 includes a crystalline material (e.g., polycrystalline silicon) and oxygen dopants. The crystalline material of the trap-rich layer 12 includes crystal defects having dislocations. The crystal defects are configured to trap carriers in the semiconductor substrate 10 and/or in the insulative layer 14. By trapping the carriers within the crystal defects of the crystalline material of the trap-rich layer 12, parasitic surface conduction which may result in non-linear distortion to RF signals may be mitigated. In some embodiments, the SOI substrate 2 may undergo some anneal operations or experience high temperature. The oxygen dopants of the trap-rich layer 12 is configured to block the grains of the crystalline material from abutting each other, and thus may help to inhibit regrowth of the grains during anneal operations or at high temperature. By virtue of the oxygen dopants, the grains of the crystalline material may be controlled to have smaller grain size and fine grain structure, and thus the trap density of the trap-rich layer 12 can be increased.

In some embodiments of the present disclosure, the composite semiconductor substrate includes a trap-rich layer interposed between a semiconductor bulk substrate and an insulative layer. The trap-rich layer may be an oxygen-doped crystalline semiconductor layer includes a crystalline semiconductor material such as a polycrystalline silicon, and oxygen dopants distributed in the crystalline semiconductor material. The oxygen-doped crystalline semiconductor layer is configured to trap carriers. The oxygen dopants in the oxygen-doped crystalline semiconductor layer can help to inhibit growth of grain size of the crystalline semiconductor material when forming the crystalline semiconductor material. The oxygen dopants in the oxygen-doped crystalline semiconductor layer can further help to inhibit regrowth of grain size of the polycrystalline silicon during successive thermal operations. By virtue of the oxygen dopants, the grain size of the crystalline semiconductor material in the oxygen-doped crystalline semiconductor layer may be controlled to be smaller than or equal to 0.1 micrometers. The oxygen dopants in the oxygen-doped crystalline semiconductor layer can also help to generate more grain boundaries with more crystal defects in the crystalline semiconductor material, and thus the carrier trapping ability of the oxygen-doped crystalline semiconductor layer can be increased. Accordingly, parasitic capacitance of the composite semiconductor substrate can be reduced, and leakage current can be alleviated. For some high frequency applications such as radio frequency (RF) communication circuits application, the reduced parasitic capacitance and reduced leakage current can help to alleviate non-linear distortion to RF signals, and help to improve RF device performance.

In some embodiments, a composite semiconductor substrate includes a semiconductor substrate, an oxygen-doped crystalline semiconductor layer and an insulative layer. The oxygen-doped crystalline semiconductor layer is over the semiconductor substrate, and the oxygen-doped crystalline semiconductor layer includes a crystalline semiconductor material and a plurality of oxygen dopants. The insulative layer is over the oxygen-doped crystalline semiconductor layer.

In some embodiments, a semiconductor device includes a composite semiconductor substrate, and a semiconductor component. The composite semiconductor substrate includes a semiconductor substrate, a trap-rich layer and an insulative layer. The trap-rich layer is over the semiconductor substrate. The trap-rich layer includes a crystalline material, and a plurality of oxygen dopants in the crystalline material. The insulative layer is over the trap-rich layer. The semiconductor component is over the composite semiconductor substrate.

In some embodiments, a method for manufacturing a composite semiconductor substrate includes the following operations. A semiconductor substrate is received. A trap-rich layer including a crystalline material is formed over the semiconductor substrate. A plurality of oxygen dopants are formed in the crystalline material. An insulative layer is formed over the trap-rich layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A composite semiconductor substrate, comprising:
   a semiconductor substrate;
   an oxygen-doped crystalline semiconductor layer over the semiconductor substrate, wherein the oxygen-doped crystalline semiconductor layer comprises a crystalline semiconductor material and a plurality of oxygen dopants;
   an insulative layer over the oxygen-doped crystalline semiconductor layer; and
   an active layer over the insulative layer, wherein the oxygen-doped crystalline semiconductor layer is separated from the active layer by the insulative layer, the active layer is in contact with the insulative layer, and the insulative layer is in contact with the oxygen-doped crystalline semiconductor layer.

2. The composite semiconductor substrate of claim 1, wherein the crystalline semiconductor material comprises polycrystalline silicon.

3. The composite semiconductor substrate of claim 1, wherein the insulative layer comprises a buried oxide layer.

4. The composite semiconductor substrate of claim 1, wherein a grain size of the crystalline semiconductor material is smaller than or equal to 0.1 micrometers.

5. The composite semiconductor substrate of claim 4, wherein the grain size of the crystalline semiconductor material is substantially ranging from 0.03 micrometers to 0.1 micrometers.

6. The composite semiconductor substrate of claim 1, wherein a thickness of the crystalline semiconductor material is smaller than or equal to 2.5 micrometers.

7. The composite semiconductor substrate of claim 1, wherein a ratio of an amount of the oxygen dopants to an amount of the crystalline semiconductor material is ranging from about 0.05 to about 0.1.

8. The composite semiconductor substrate of claim 1, wherein a concentration of the plurality of oxygen dopants in the oxygen-doped crystalline semiconductor layer varies along a depth direction.

9. A semiconductor device, comprising:
   a composite semiconductor substrate, comprising:
      a semiconductor substrate;
      a trap-rich layer over the semiconductor substrate, the trap-rich layer comprising:
         a crystalline material; and
         a plurality of oxygen dopants in the crystalline material;
      an insulative layer over the trap-rich layer;
      an active layer over the insulative layer, wherein the trap-rich layer is separated from the active layer, the insulative layer has a first surface facing and contacting the trap-rich layer, and a second surface facing and contacting the active layer; and
   a semiconductor component over the composite semiconductor substrate, wherein the semiconductor component is separated from the trap-rich layer.

10. The semiconductor device of claim 9, wherein the crystalline material comprises polycrystalline semiconductor material.

11. The semiconductor device of claim 9, wherein the insulative layer comprises a thermal oxide layer.

12. The semiconductor device of claim 9, wherein a grain size of the crystalline material is smaller than or equal to 0.1 micrometers.

13. The semiconductor device of claim 12, wherein the grain size of the crystalline material is substantially ranging from 0.03 micrometers to 0.1 micrometers.

14. The semiconductor device of claim 9, wherein a ratio of an amount of the oxygen dopants to an amount of the crystalline material is ranging from about 0.05 to about 0.1.

15. The semiconductor device of claim 9, wherein the semiconductor component comprises a radio frequency (RF) device.

16. The semiconductor device of claim 9, wherein the crystalline material of the trap-rich layer comprises crystal defects having dislocations, and the crystal defects are configured to trap carriers in the semiconductor substrate or in the insulative layer.

17. The semiconductor device of claim 9, wherein the plurality of oxygen dopants of the trap-rich layer is configured to block a plurality of grains of the crystalline material from abutting each other.

18. A composite semiconductor substrate, comprising:
   a semiconductor substrate;
   an insulative layer over the semiconductor substrate;

a trap-rich layer interposed between the semiconductor substrate and the insulative layer, wherein the trap-rich layer comprises a crystalline semiconductor material, a plurality of oxygen dopants distributed in the crystalline semiconductor material, and a concentration of the plurality of oxygen dopants in the trap-rich layer varies along a depth direction; and an active layer over the insulative layer, wherein the active layer abuts the insulative layer, and the insulative layer directly abuts the trap-rich layer.

19. The composite semiconductor substrate of claim 18, wherein the concentration of the plurality of oxygen dopants in the trap-rich layer increases along the depth direction from an upper surface distal to the semiconductor substrate to a bottom surface proximal to the semiconductor substrate.

20. The composite semiconductor substrate of claim 18, wherein the concentration of the plurality of oxygen dopants in the trap-rich layer decreases along the depth direction from an upper surface distal to the semiconductor substrate to a bottom surface proximal to the semiconductor substrate.

* * * * *